(12) United States Patent
Makita et al.

(10) Patent No.: US 7,369,593 B2
(45) Date of Patent: May 6, 2008

(54) SEMICONDUCTOR LASER AND METHOD FOR MANUFACTURING THE SAME

(75) Inventors: Kouji Makita, Akou (JP); Hideto Adachi, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 418 days.

(21) Appl. No.: 10/920,545

(22) Filed: Aug. 17, 2004

(65) Prior Publication Data

US 2005/0041710 A1 Feb. 24, 2005

(30) Foreign Application Priority Data

Aug. 18, 2003 (JP) .............. 2003-294475

(51) Int. Cl.
*H01S 5/00* (2006.01)
(52) U.S. Cl. .................. 372/45.01; 372/46.01
(58) Field of Classification Search ............. 372/45.01, 372/46.01
See application file for complete search history.

(56) References Cited

U.S. PATENT DOCUMENTS 6,345,064 B1 * 2/2002 Fujii ................ 372/46.01

2002/0195633 A1 12/2002 Nagano et al.
2006/0011946 A1 * 1/2006 Toda et al. ............. 257/202

FOREIGN PATENT DOCUMENTS

| CN | 1393931 | 1/2003 |
|---|---|---|
| JP | 2-54591 | 2/1990 |
| JP | 6-237038 | 8/1994 |
| JP | 11-186650 | 7/1999 |

* cited by examiner

*Primary Examiner*—Dung (Michael) T. Nguyen
(74) *Attorney, Agent, or Firm*—Hamre, Schumann, Mueller & Larson, P.C.

(57) ABSTRACT

The semiconductor laser of the present invention includes a first conductivity-type cladding layer, a second conductivity-type cladding layer having at least one ridge structure extending in the direction of a resonator, an active layer disposed between the two cladding layers and a current blocking layer provided so as to cover at least a side face of the ridge structure. The current blocking layer includes a hydrogenated first dielectric film. In the structure having the current blocking layer formed of a dielectric, a light confining efficiency is enhanced, a threshold value of laser oscillation decreases, and current properties during the oscillation at a high temperature and with a high power are improved.

16 Claims, 8 Drawing Sheets

SEMICONDUCTOR LASER AND METHOD FOR MANUFACTURING THE SAME

FIELD OF THE INVENTION

The present invention relates to a semiconductor laser used for a light source of an optical disk system and the like, in particular, a semiconductor laser having a ridge-type stripe structure, in which a current is constricted with a dielectric film, allowing a burying growth step to be eliminated.

BACKGROUND OF THE INVENTION

In recent years, due to the widespread use of DVDs and CDs, semiconductor lasers are used in various fields, and reductions in their manufacturing cost and lead time are strongly required.

A burying ridge-type stripe structure that is generally used for a semiconductor laser is shown in FIG. 6 (see JP6(1994)-237038 A). This structure is formed by the method described below.

First, a buffer layer 202, a first conductivity type cladding layer 203, a guide layer 204, an active layer 205, a guide layer 206, a second conductivity-type cladding layer 207, a hetero buffer layer 208 and a cap layer 209 are grown epitaxially on a first conductivity-type substrate 201 using an organometallic vapor phase growing method (hereinafter, called MOCVD method).

An insulating layer (not shown in the figure) is formed on the cap layer 209 and is formed into a stripe pattern, and then the second conductivity-type cladding layer 207 is formed into a ridge shape by etching with the stripe pattern as a mask. Subsequently, a first conductivity-type current blocking layer 210 is grown selectively using the MOCVD method. After removing the stripe pattern, a second conductivity-type contact layer 211 is grown using the MOCVD method. Moreover, a n-side electrode 212 and a p-side electrode 213 respectively are formed.

With this structure, the MOCVD process is carried out three times in the manufacturing process, thus it is hard to reduce the manufacturing cost.

Next, a ridge-type stripe structured semiconductor laser having a dielectric film as a current blocking layer is illustrated in FIG. 7A (see JP11(1999)-186650 A). In the process of forming this structure, a buffer layer 302, a first conductivity-type cladding layer 303, a guide layer 304, an active layer 305, a guide layer 306, a second conductivity-type cladding layer 307, a hetero buffer layer 308 and a cap layer 309 are grown epitaxially on a first conductivity-type substrate 301 using the MOCVD method. An insulating layer (not shown in the figure) is formed on the cap layer 309 and is formed into a stripe pattern, thereafter, the second conductivity-type cladding layer 307 is formed into a ridge shape by etching with the stripe pattern as a mask. Moreover, a current blocking layer 310 made of a dielectric film is provided to both sides of the ridge. Furthermore, a n-side electrode 311 and a p-side electrode 312 respectively are formed.

Since the ridge-type stripe structure using the dielectric film requires the MOCVD process to be carried out only once, the manufacturing cost can be reduced compared to that in the example of FIG. 6. In addition, by virtue of the reduction in the number of growing steps, lead time in manufacturing processes also can be reduced. Particularly in a monolithic dual wavelength laser, steps of crystal growth and manufacturing processes are more complicated, thus it is considered that the cost and the manufacturing lead time can be reduced dramatically by adopting the structure of FIG. 7A.

The laser having the ridge-type stripe structure shown in FIG. 7A, which is manufactured using the epitaxial growth only once, uses as the current blocking layer a dielectric film, such as a silicon oxide film (hereinafter, called $SiO_2$) or a silicon nitride film (hereinafter, called SiN), which has a considerably small refractive index in comparison with that of an AlGaAs based or AlGaInP based semiconductor layer. The refractive indices with respect to light with a wavelength of 650 nm are, for example, AlGaAs=3.1 to 4.1 and AlGaInP=3.2 to 3.6; while $SiO_2$=1.5 and SiN=2.0.

Accordingly, the difference in a refractive index between the current blocking layer and the semiconductor layer composing the ridge portion and the cladding layer becomes larger. Therefore, in order to adjust a flare angle of outgoing light, it is necessary to increase a film thickness H of the second conductivity-type cladding layer 307 outside the ridge portion, which is shown in FIG. 7A, so as to strengthen the light confinement. According to this, as shown in FIG. 7B, an ineffective component 314 of a current to be injected to the active layer 305, which leaks out of the light-emission region 313, increases, thus causing a problem of the increment of an operation current. The increment of the operation current has a risk of degrading the temperature properties of the semiconductor laser element and degrading significantly the reliability at a high temperature.

SUMMARY OF THE INVENTION

In order to overcome the above-mentioned drawbacks in the conventional examples, it is an object of the present invention to provide a ridge-type stripe structured semiconductor laser having a dielectric film as a current blocking layer, which has a small enough absorption coefficient with respect to an emission wavelength, and has a sufficiently small difference in refractive index from that of a cladding layer. Thus it is suitable for confining light, so that the semiconductor laser has a small threshold value of laser oscillation, and shows excellent current properties during oscillating at a high temperature and with a high power. Further, it is also an object of the present invention to provide a method of manufacturing such a semiconductor laser.

In order to solve the above-mentioned problems, the semiconductor laser of the present invention includes a first conductivity-type cladding layer, a second conductivity-type cladding layer having at least one ridge structure extending in a direction of a resonator, an active layer disposed between the two cladding layers and a current blocking layer provided so as to cover at least a side face of the ridge structure. The current blocking layer includes a hydrogenated first dielectric film.

DESCRIPTION OF THE PREFERRED EMBODIMENTS

In the semiconductor laser of the present invention, a hydrogenated first dielectric film, which has a large refractive index with respect to an emission wavelength and a sufficiently small absorption coefficient, is used as a current blocking layer. Thereby, the difference in refractive index between the inside of a ridge portion and the outside thereof can decrease. Accordingly, an ineffective current introduced to an active layer can be reduced, and a threshold current of an element also can decrease, whereby a semiconductor laser element that has excellent current properties during the oscillation at a high temperature and with a high power can be manufactured at a high yield.

In the semiconductor laser of the present invention, the current blocking layer preferably includes a second dielectric film disposed between the first dielectric film and the ridge structure for preventing the diffusion of hydrogen. This configuration can suppress the occurrence of an obstacle in the current blocking layer or the like due to the diffusion of hydrogen from the first dielectric film.

The first dielectric film preferably is amorphous silicon, and the film thickness of the amorphous silicon preferably is 0.1 μm or larger.

Further preferably, second dielectric films are provided on both surfaces of the first dielectric film.

Also, the second dielectric film preferably includes nitrogen or aluminum. In particular, the second dielectric film preferably is composed of silicon nitride (SiN), aluminum nitride (AlN), aluminum oxide ($Al_2O_3$), a compound containing these materials, or titanium aluminum nitride (AlTiN).

The first dielectric film and the second dielectric film may be adjacent to each other.

It is preferable that the film thickness of the second dielectric film is in a range of 2 nm to 50 nm, inclusive, and more preferably in a range of 5 nm to 50 nm, inclusive.

When manufacturing a semiconductor laser with one of the above-described structures, it is preferable to form the first dielectric film and the second dielectric film using an electron cyclotron resonance (hereinafter, called ECR) sputtering method or an ECR-CVD method.

Figure 8A:
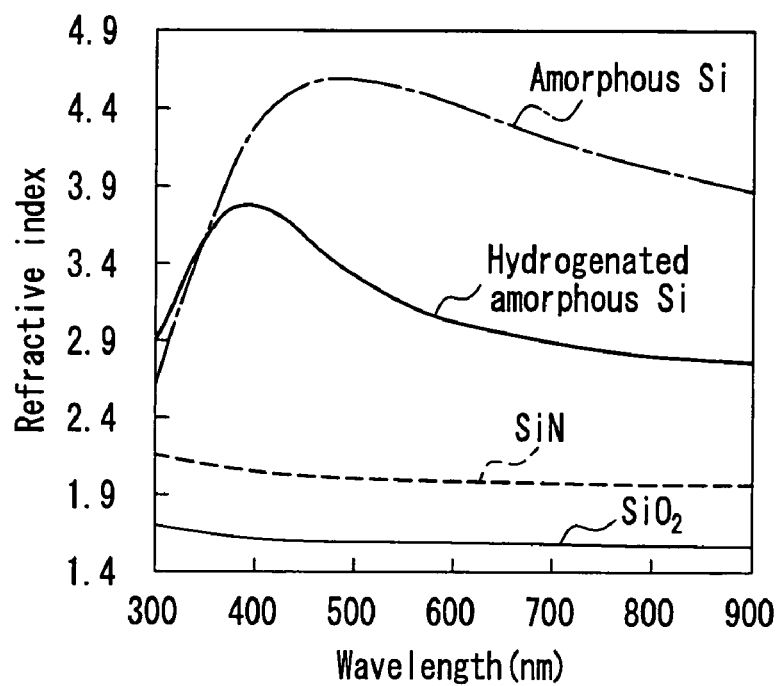
FIGS. 8A and 8B are graphs respectively showing the wavelength dependence of the refractive index and that of the absorption coefficient of various dielectric materials.
Figure 8B:
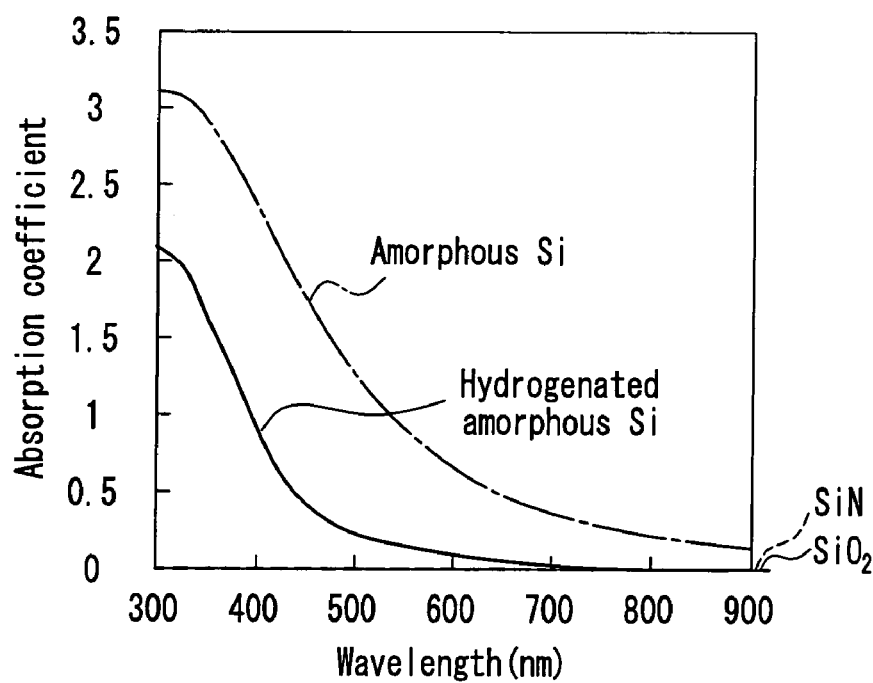

In order to solve the above-described problems of the prior art, the inventors examined using as a current blocking layer a dielectric film that has a sufficiently small absorption coefficient with respect to an emission wavelength and has a refractive index larger than that of $SiO_2$ or SiN. With regard to various dielectric materials, the wavelength dependence of the refractive index is shown in FIG. 8A, and the wavelength dependence of the absorption coefficient is shown in FIG. 8B. As a result of the examination, it was realized that hydrogenated amorphous silicon may provide a refractive index larger than that of $SiO_2$ or SiN and a sufficiently small absorption coefficient with respect to light with a wavelength of 600 nm or larger.

The inventors, therefore, examined manufacturing a semiconductor laser including this material as a current blocking layer. However, it was realized that the following problems may occur according to circumstances.

Figure 7A:
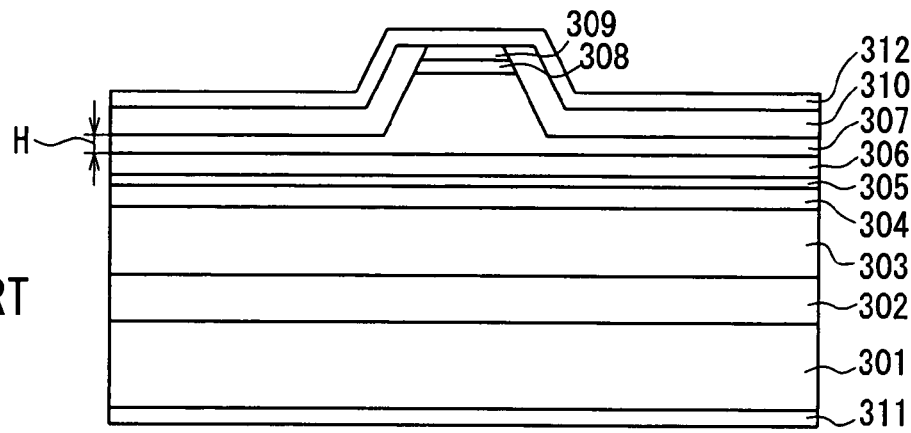
FIGS. 7A and 7B are cross sectional views of the stripe structure semiconductor laser having a dielectric film current blocking layer according to the prior art.
Figure 7B:
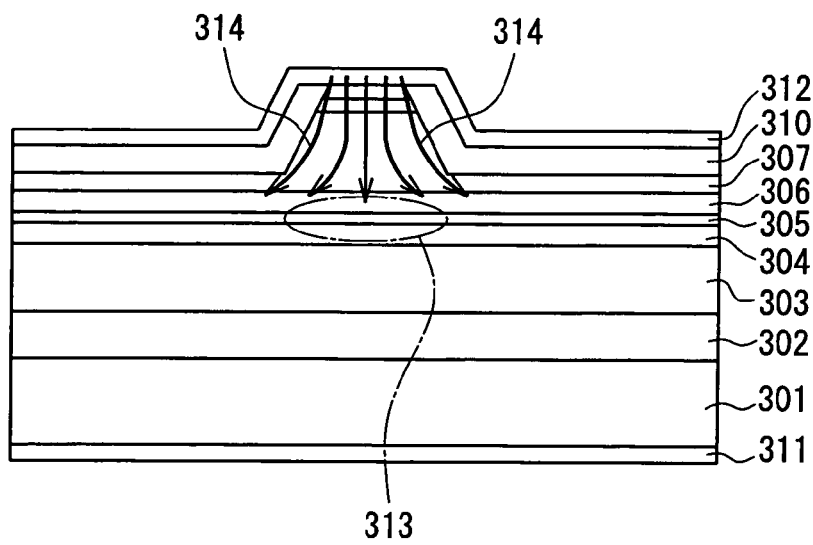

The semiconductor laser with the structure shown in FIG. 7A will be described as an example. In the manufacturing processes of this semiconductor laser, after forming the current blocking layer 310, a part of the current blocking layer 310 is removed so as to expose the top of the cap layer 309. Thereafter, the n-side electrode 311 made of Au, Ge and Ni is formed on a rear face of the substrate, the p-side electrode 312 made of Cr/Pt/Au is formed on the surface of the substrate, and an alloy processing is performed for obtaining an ohmic contact.

However, it was realized that the current blocking layer 310 and the p-side electrode 312 tend to be lifted and exfoliated during this alloy processing. This phenomenon is considered to occur because of the following reasons: in the case where a hydrogenated amorphous silicon film is used as the current blocking layer 310, the exposure of the semiconductor laser at a high temperature of 200° C. or above causes hydrogen included in the amorphous silicon film to diffuse, which accumulates between the cladding layer 307 and the current blocking layer 310 and then swells, thus leading to an exfoliation like a blister.

If such an exfoliation occurs, the insulation of the current blocking layer cannot be maintained, thus a large amount of ineffective current flows to the laser, resulting in an increase in an operation current. If the state of the exfoliation is remarkable, the electrode itself may be scattered in pieces.

Figure 9A:
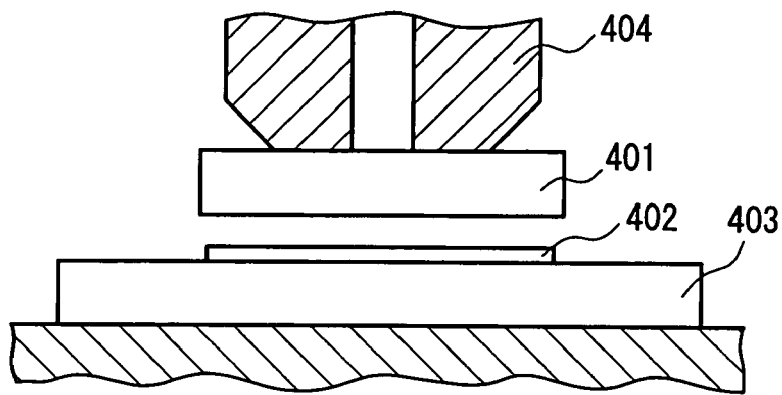
FIGS. 9A to 9C are cross sectional views showing the mounting process of the semiconductor laser according to the prior art.
Figure 9B:
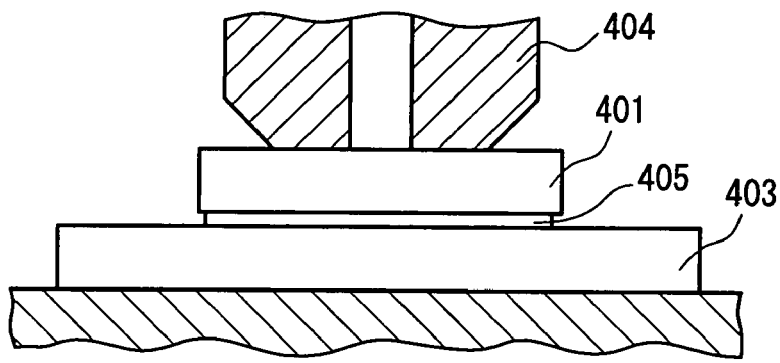
Figure 9C:
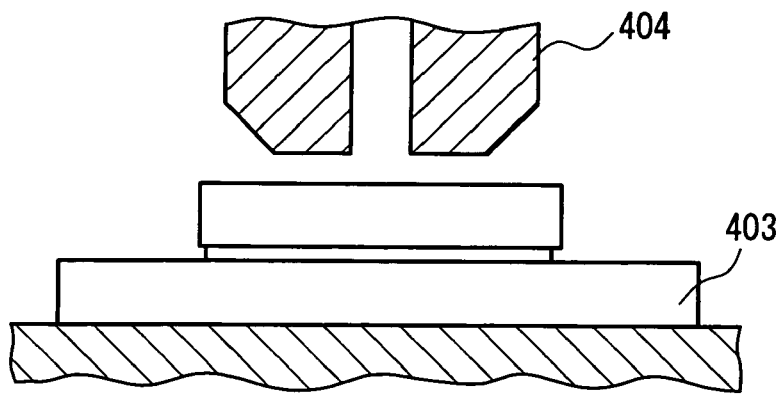

Also, in the mounting process of a semiconductor laser and a sub-mount, a similar failure is thought to occur. The mounting of a high-power semiconductor laser will be described with reference to FIGS. 9A to 9C. In the mounting process, firstly as shown in FIG. 9A, a high-power semiconductor laser 401 is held by a collet 404 to be mounted on a member such as a sub-mount 403 via solder 402. During this process, the sub-mount 403 is heated at the melting point of solder 402 or higher. After the high-power semiconductor laser 401 is lowered to the state illustrated in FIG. 9B, the sub-mount 403 and the semiconductor laser 401 are pressed and bonded with each other. Thereafter, the collet 404 is raised as shown in FIG. 9C.

In the above-stated process, when the sub-mount 403 and the semiconductor laser 401 are pressed and bonded with each other, a residual stress tends to be generated due to a load by the collet 404 and the shape of the high-power semiconductor laser element 401. This results from a general structure of the high-power semiconductor laser 401 in which a resonator length of 0.5 to 1 mm is relatively longer than a width.

A semiconductor laser element normally is bonded with a sub-mount at a surface close to the light-emission region, which is called junction down, in order to have good heat dissipation properties, and therefore the residual stress generated inside the semiconductor laser element also concentrates on a junction with the sub-mount. Thus, a distortion due to the residual stress may lead to the deterioration of laser properties and degrade the reliability over a long term operation.

To mitigate such residual stress, some methods are adopted in which the high-power semiconductor laser 401 is mounted at a high temperature of 200° C. or above, or heat is applied again so as to allow the solder 402 to melt again (to 350° C.) under a condition without a load where the collet 404 is released after the mounting.

However, when a high-power semiconductor laser is manufactured so as to satisfy the structure and conditions as mentioned above, a current blocking layer including a hydrogenated film may be exposed at the high temperature of 200° C. or above, and hydrogen included in the hydrogenated film may diffuse, thereby resulting in a film exfoliation like a blister.

Furthermore, the refractive index of the hydrogenated amorphous silicon film changes due to the desorption of hydrogen caused by the application of heat, and the absorption coefficient increases, although the amorphous silicon film is intended to reduce the absorption coefficient. Consequently, a light confining property changes, thereby resulting in the deterioration of laser properties.

As mentioned above, it is realized that this problem can be solved when the current blocking layer includes a second dielectric film disposed between the first dielectric film and the ridge structure for preventing the diffusion of hydrogen. This configuration can suppress the occurrence of an obstacle in the current blocking layer or the like due to the diffusion of hydrogen from the first dielectric film.

The semiconductor laser according to the embodiments of the present invention and the method for manufacturing the same will be specifically described below with reference to the drawings.

Embodiment 1

Figure 1:
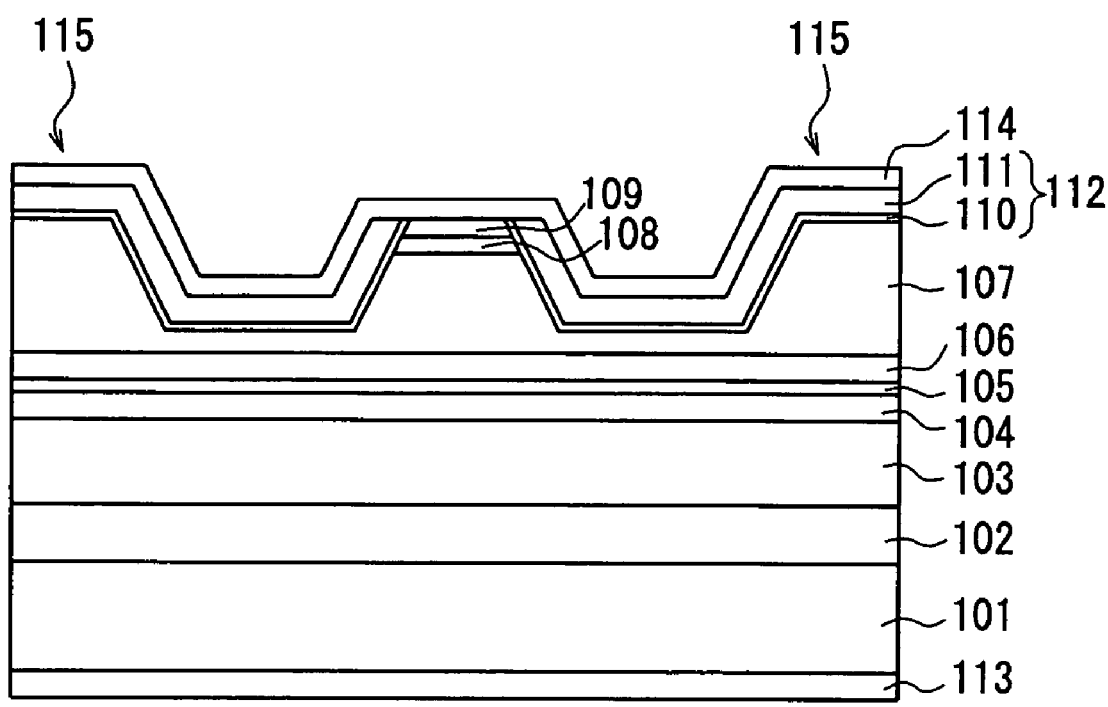
FIG. 1 is a cross sectional view showing the structure of the semiconductor laser according to Embodiment 1.

FIG. 1 is a cross sectional schematic view of an AlGaInP based laser according to Embodiment 1. The semiconductor laser of the present embodiment has a ridge-type stripe structure, in which a n-type GaAs buffer layer 102, a n-type AlGaInP cladding layer 103, an undoped AlGaInP optical guide layer 104, a multiple quantum well active layer 105, an undoped AlGaInP optical guide layer 106, a p-type AlGaInP cladding layer 107, a p-type GaInP hetero buffer layer 108, a p-type GaAs cap layer 109 and a laminated current blocking payer 112 are formed on a n-type GaAs substrate 101, and further, a n-side electrode 113 is formed on the rear face of the n-type substrate 101, and a p-side electrode 114 is formed on the contact layer 109.

Specific examples of each layer will be described below. The n-type GaAs substrate 101 may be formed of a Si-doped n-type GaAs. The n-type GaAs buffer layer 102 may be formed of a Si-doped n-type GaAs (Si concentration: $n=2 \times 10^{18}$ cm$^{-3}$, film thickness: $t=0.5$ μm). The n-type AlGaInP cladding layer 103 may be formed of a Si-doped n-type $(Al_{0.7}Ga_{0.3})_{0.5}In_{0.5}P$ (carrier density: $1 \times 10^{18}$ cm$^{-3}$, $t=1.5$ μm). The undoped AlGaInP optical guide layer 104 may be formed of an undoped $(Al_{0.5}Ga_{0.5})_{0.5}In_{0.5}P$ ($t=25$ nm).

The multiple quantum well active layer 105 may include an undoped $(Al_{0.5}Ga_{0.5})_{0.5}In_{0.5}P$ well ($t=5$ nm: three layers) and an undoped $Ga_{0.5}In_{0.5}P$ well ($t=6$ nm: four layers). The undoped AlGaInP optical guide layer 106 may be formed of an undoped $(Al_{0.5}Ga_{0.5})_{0.5}In_{0.5}P$ ($t=25$ nm). The p-type AlGaInP cladding layer 107 may be formed of a Zn-doped p-type $(Al_{0.7}Ga_{0.3})_{0.5}In_{0.5}P$ (carrier density: $1 \times 10^{18}$ cm$^{-3}$, $t=1.3$ μm).

The p-type GaInP hetero buffer layer 108 may be formed of a Zn-doped p-type $Ga_{0.5}In_{0.5}P$ (carrier density: $1 \times 10^{18}$ cm$^{-3}$, $t=50$ μm). The p-type GaAs cap layer 109 may be formed of a Zn-doped p-type GaAs (carrier density: $1 \times 10^{19}$ cm$^{-3}$, $t=200$ nm). The laminated current blocking layer 112 includes a silicon nitride film 110 ($t=10$ nm) and a hydrogenated amorphous silicon film 111 ($t=100$ nm).

Also, a pair of protruding portions 115 that are higher than the ridge portion are formed so as to interpose the ridge portion therebetween, thereby reducing the damage to the ridge portion when being assembled in a junction down manner.

Furthermore, a window structure is formed on a resonator end face of the laser, which is not illustrated in the drawing. The window structure enlarges a band gap by intercrystallizing the multiple quantum well structure by Zn diffusion, and reduces the absorption of light with an emission wavelength, thereby suppressing the optical damage of the end face.

Figure 2A:
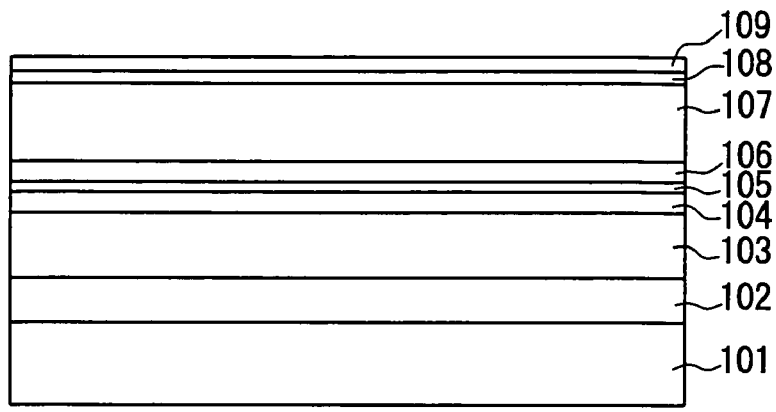
FIGS. 2A to 2C are cross sectional views showing the manufacturing process of the semiconductor laser according to Embodiment 1.
Figure 2B:
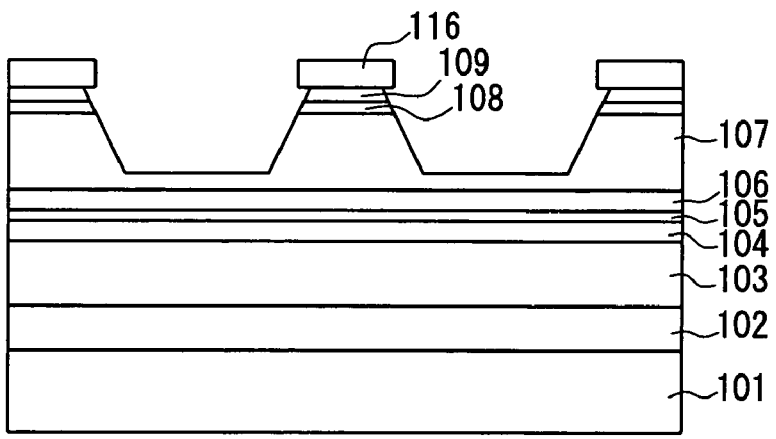
Figure 2C:
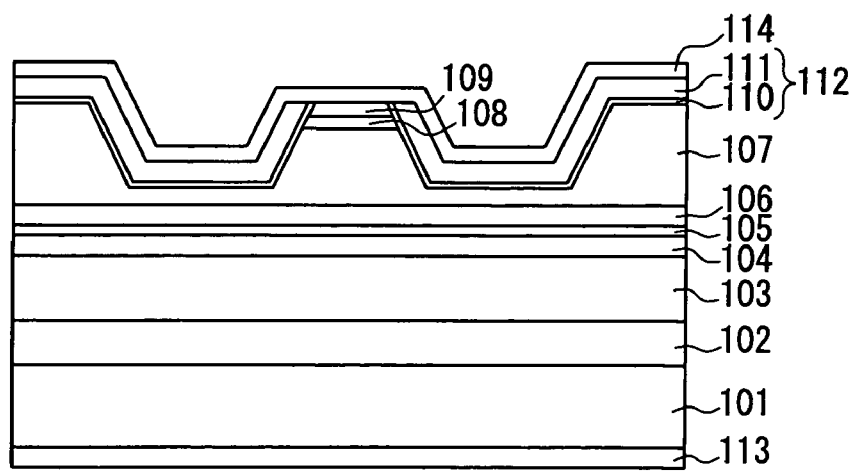

Next, the method for manufacturing the semiconductor laser illustrated in FIG. 1 will be described. FIGS. 2A to 2C are cross sectional views showing an example of each process of a method for manufacturing the semiconductor laser of the present embodiment.

The crystal growth of the cladding layers 103, 107, the active layer 105 and the like was performed using a MOCVD method, and trimethylgallium (TMG), trimethylaluminum (TMAl), trimethylindium (TMIn), phosphine ($PH_3$) and arsine ($AsH_3$) were used as material gas, when performing the crystal growth of AlGaInP, AlInP, GaInP and GaAs.

When conducting p-type and n-type doping, dimethylzinc (DMZn) and monosilane ($SiH_4$) were respectively used. The n-type GaAs substrate 101 was heated using a resistive heater. Here, the growth temperature was 660° C. and the pressure in growth atmosphere was 4666 Pa (=35 Torr). The growth rate was approximately 2 μm per hour.

First, as shown in FIG. 2A, the n-type GaAs substrate 101 was mounted in a MOCVD reactor, and the n-type GaAs buffer layer 102, the n-type $(Al_{0.7}Ga_{0.3})_{0.5}In_{0.5}P$ cladding layer 103, the undoped $(Al_{0.5}Ga_{0.5})_{0.5}In_{0.5}P$ optical guide layer 104, the active layer 105, the undoped $(Al_{0.5}Ga_{0.5})_{0.5}In_{0.5}P$ optical guide layer 106, the p-type $(Al_{0.7}Ga_{0.3})_{0.5}In_{0.5}P$ cladding layer 107, the p-type $Ga_{0.5}In_{0.5}P$ buffer layer 108 and the p-type GaAs cap layer 109 were grown successively so as to manufacture a heterostructured substrate. After taking the heterostructured substrate out from the MOCVD reactor, a ZnO film (not shown in the figure) was selectively formed at the area that would be the resonator end face, and was subjected to a heat diffusion so as to intercrystallize the multiple quantum well structure, thereby forming an end face window structure.

Next, a silicon oxide film 116 was deposited in a thickness of 0.3 μm using an atmospheric pressure heat CVD method (370° C.) as shown in FIG. 2B. Thereafter, the silicon oxide film 116 was formed into a stripe pattern with a width of 2 μm by a photolithography and a dry etching technique. By selectively etching the p-type GaAs cap layer 109 using a sulfuric acid etchant, the p-type $Ga_{0.5}In_{0.5}P$ buffer layer 108 using a hydrochloric acid etchant, and the p-type $(Al_{0.7}Ga_{0.3})_{0.5}In_{0.5}P$ cladding layer 107 using a sulfuric or hydrochloric acid etchant with this pattern as a mask, a mesa structure illustrated in FIG. 2B was formed.

Subsequently, all the stripe pattern of the silicon oxide film 116 was removed using a hydrofluoric acid etchant as shown in FIG. 2C, and the silicon nitride film 110 ($t=10$ nm) and the hydrogenated amorphous silicon film 111 ($t=100$ nm) were deposited in this order using an ECR-CVD apparatus so as to form the current blocking layer 112.

The silicon nitride film 110 has a barrier property against the diffusion of hydrogen in the hydrogenated amorphous silicon film 111 at a high temperature (>200° C.), and the silicon nitride film with the thickness of 5 nm or larger is capable of suppressing the desorption of hydrogen until the temperature reaches 350° C. or above. It is not preferable for the silicon nitrogen film 110 to be 2 nm or smaller in thickness, because the barrier property against hydrogen, which is the objective of the present embodiment, may be reduced. In light of the barrier property, the thickness of the silicon nitride film is preferably 5 nm or larger. However, the thickness of the silicon nitride film is preferably 50 nm or smaller, because when it is larger than 50 nm, delamination may occur due to an applied stress. When the thickness of the silicon nitride film is in this range, a light confining property is not affected greatly.

Thereafter, by a photolithography process and an etching process, the silicon nitride film 110 and the hydrogenated amorphous silicon film 111 on the top of the p-type GaAs cap layer 109 in the ridge structure were etched away. A dry etching using $CF_4$ gas was employed as an example of this etching. In this process, the current blocking layer 112 in the window region near the resonator end face was left so as to suppress the injection of an ineffective current to the window region.

Finally, the n-side electrode 113 made of Au, Ge and Ni was formed on the rear face of the substrate 101, and the p-side electrode 114 made of Cr/Au/Pt was formed on the surface of the hydrogenated amorphous silicon film 111 and the cap layer 109, thereby obtaining a semiconductor laser with the structure shown in FIG. 1.

Here, in the light of the below-described experimental results, the temperature for an alloy processing for obtaining an ohmic contact at the n-side electrode was determined to be 350° C. or lower.

The behavior of the semiconductor laser of the present embodiment was compared with that of a semiconductor laser that did not include a silicon nitride film in the current blocking layer, while being mounted at a high temperature. In the comparative experiment, an alloy processing for forming the electrode was performed in nitrogen atmosphere at 350° C. for 10 minutes, and the surface condition of the p-side electrode of each semiconductor laser was observed using a microscope.

As a result, in the semiconductor laser including the silicon nitride film in the current blocking layer, the lifting of the p-side electrode was not observed. Whereas, in the semiconductor laser that did not include the silicon nitride film in the current blocking layer, the lifting of the p-side electrode was observed in many parts. In addition, it was confirmed that this lifting occurred due to the exfoliation between the side face of the ridge portion and the hydrogenated amorphous silicon film.

According to the above results, it was confirmed that the exfoliation of the current blocking layer did not occur in the semiconductor laser of the present embodiment, in which the silicon nitride film was used as a barrier layer against hydrogen, even when being subjected to a high temperature of approximately 350° C.

Next, the characteristics of the semiconductor laser of the present embodiment will be described below, compared with a semiconductor laser according to the conventional technique.

Figure 3A:
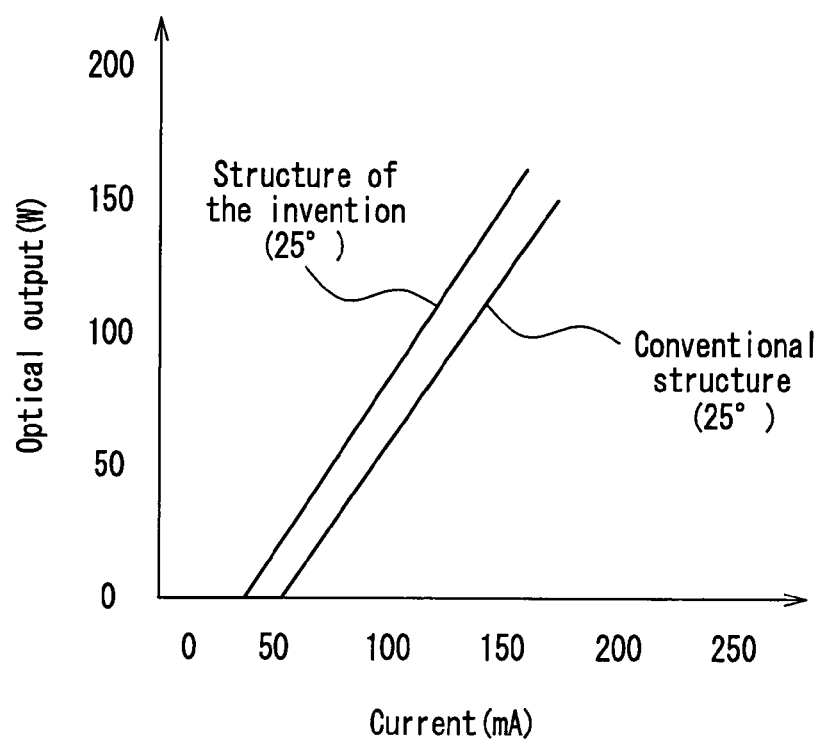
FIGS. 3A and 3B are graphs showing the current properties of the semiconductor laser according to Embodiment 1.
Figure 3B:
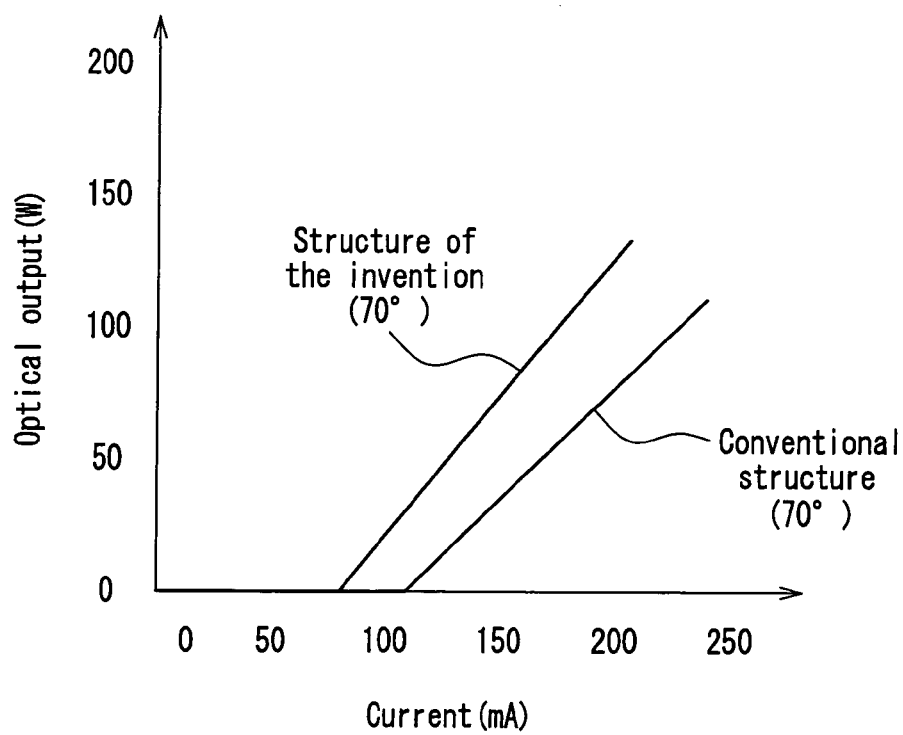

FIGS. 3A and 3B show current-optical output properties of the semiconductor laser according to Embodiment 1. FIG. 3A shows the measurement result at 25° C. and FIG. 3B shows that at 75° C. The measurement was performed by applying a pulse current (pulse period: 200 nsec, duty ratio: 50%) to the semiconductor laser.

As illustrated in FIG. 3A, a threshold current of a red semiconductor laser manufactured according to the structure of the present embodiment decreased to approximately 70% of that of a red semiconductor laser in which a conventional SiN film was used as the current blocking layer. In addition, an operation current value at a high temperature decreased as well as shown in FIG. 3B, thereby realizing a semiconductor laser element having excellent current properties during the oscillation with a high power.

Figure 4:
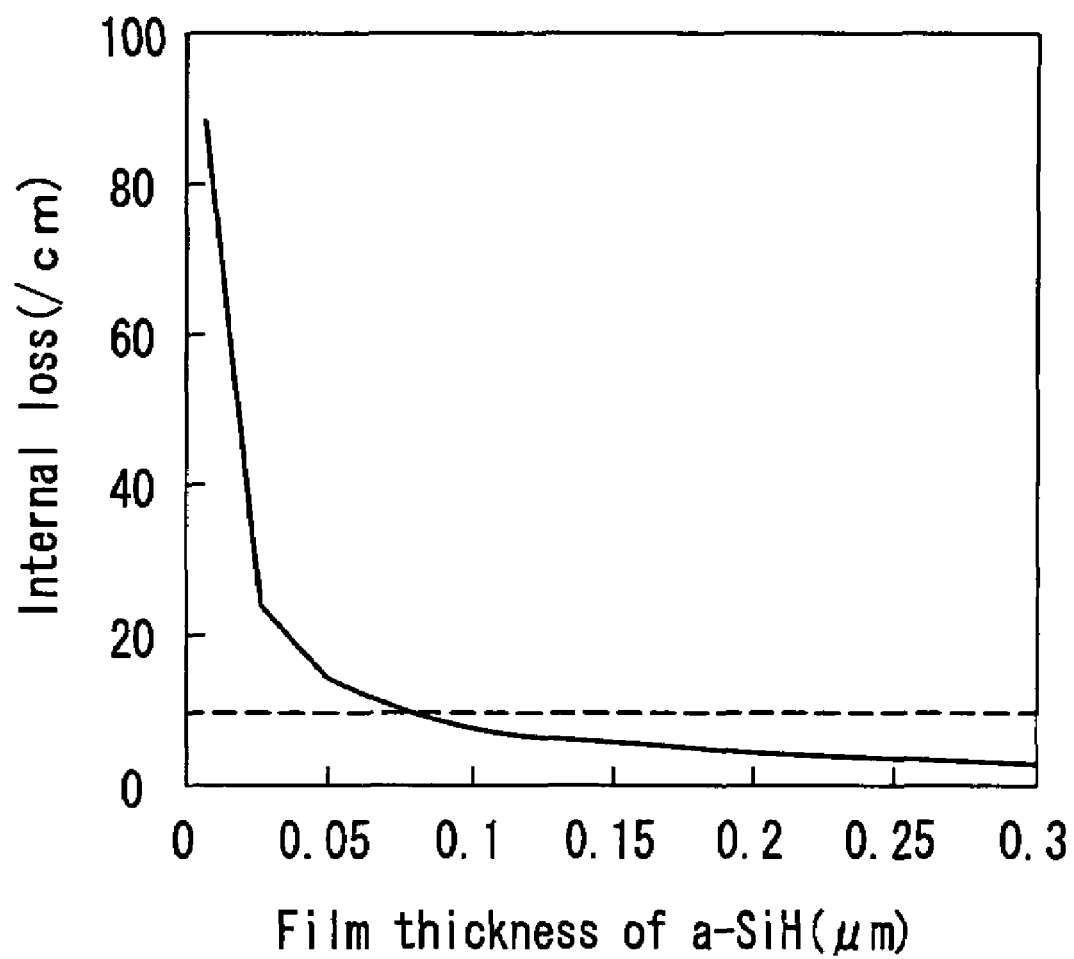
FIG. 4 is a graph showing the relationship between the internal loss of the semiconductor laser according to Embodiment 1 and the film thickness of the hydrogenated amorphous silicon.

FIG. 4 shows the relationship between the film thickness and the internal loss of the semiconductor laser in the case where the hydrogenated amorphous silicon is applied to the current blocking layer. This internal loss preferably is below $0.1/cm^{-1}$ in practical use, but it is shown that the internal loss can be sufficiently small when the film thickness of the hydrogenated amorphous silicon is 0.1 μm or larger. Consequently, the film thickness of the hydrogenated amorphous silicon preferably is 0.1 μm or larger.

Embodiment 2

Figure 5:
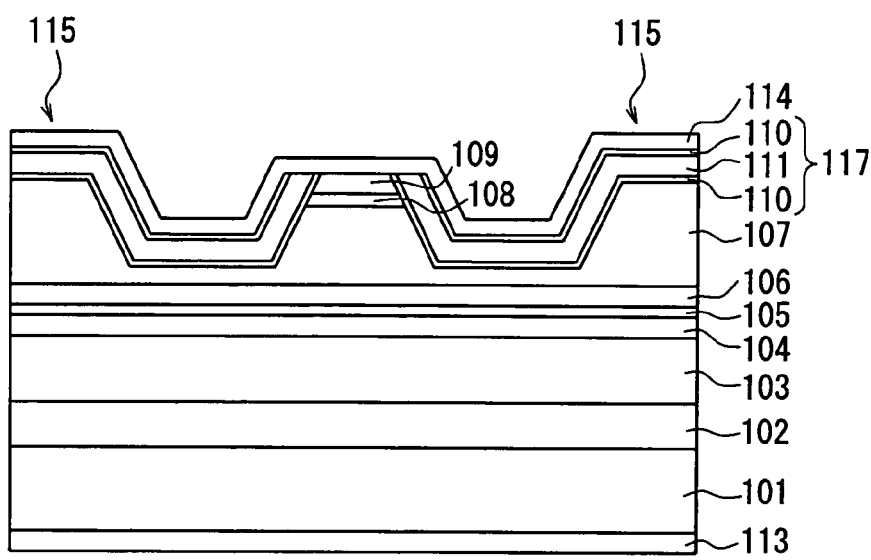
FIG. 5 is a cross sectional view showing the structure of the semiconductor laser according to Embodiment 2.
Figure 6:
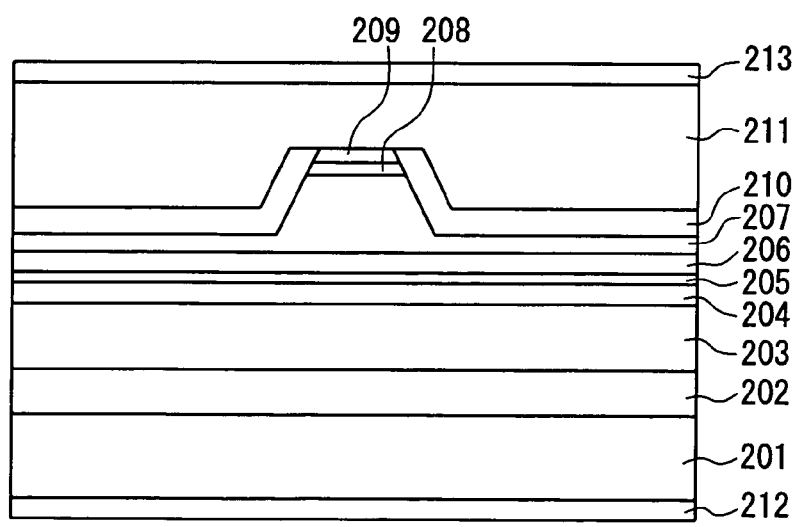
FIG. 6 is a cross sectional view of the burying ridge-type stripe structure semiconductor laser according to the prior art.

FIG. 5 is a cross sectional view showing the structure of the semiconductor laser according to Embodiment 2. Since the basic structure thereof is similar to that of the semiconductor laser shown in FIG. 1, the same elements are assigned the same reference numerals and the specific explanations thereof will not be repeated. This semiconductor laser is different from the semiconductor laser according to Embodiment 1 in the point that a current blocking layer 117 has a three layered structure in which the hydrogenated amorphous silicon film 111 is sandwiched between the silicon nitride films 110.

When hydrogen included in the hydrogenated amorphous silicon film thermally diffuses toward the outside, the diffusion toward the interface with the ridge portion can be prevented by the silicon nitride film, which was described in Embodiment 1. In such a case, hydrogen also diffuses in the reverse direction, that is, toward the interface with the p-side electrode 114.

It is thought that the hydrogen is prevented from diffusing toward outside by an electrode material of Cr/Pt/Au. However, with regard to metal materials, it is known that the state of penetration of a light element such as hydrogen varies depending on the method for forming the film of the metal material. When the material of the electrode cannot function as a barrier against the diffusion of hydrogen, the refractive index and the absorption coefficient of the amorphous silicon film change due to the desorption of hydrogen, and desired properties may not be obtained. In addition, if hydrogen desorbs abruptly, hydrogen accumulates between the electrode and the current blocking layer, whereby the exfoliation of the electrode or the like may occur.

According to the present embodiment, not only the diffusion of hydrogen toward the interface with the ridge portion but also that toward the interface with the electrode can be prevented, thus the above-noted problems do not occur, and stable laser properties can be obtained.

Also, the structure according to the present embodiment leads to the following advantages. In general, since amorphous silicon is oxidized easily and a naturally oxidized film is formed on the surface thereof. Since the naturally oxidized film functions as an inhibiting layer, silicon and Cr that is a metal material of the lowermost layer of the electrode hardly react with each other, even when heat at approximately 350° C. is applied thereto.

However, when a pretreatment for improving the ohmic contact between the p-side electrode 114 and the cap layer 109 prior to the formation of the electrode material is performed, the naturally oxidized film may be removed. In this case, Cr and silicon react with each other even under a heat treatment as low as approximately 300° C. If such a silicide formation occurs, the insulation of the current blocking layer cannot be obtained, which results in the failure of normal operation by the laser due to the influence of the change in the refractive index, the absorption coefficient, the quality of the electrode material and the like.

With the structure of the present embodiment, a noticeable effect of preventing the above-mentioned silicide formation reaction also can be obtained.

In Embodiments 1 and 2, it is preferable to use an ECR-CVD apparatus for forming the hydrogenated amorphous silicon film so as to improve the coverage of the slope of the ridge portion, but an ECR sputtering apparatus also may be used with a rotation mechanism of the substrate and a mechanism to allow atoms that are sputtered from a target to be incident upon the substrate in an oblique direction. By using the ECR sputtering apparatus, the damage to the elements during the film formation can be minimized, and the silicon nitride film, which functions as a barrier layer against the diffusion of hydrogen in the hydrogenated amorphous silicon film, can be formed densely and uniformly. However, as long as the film is capable of covering the surface of the ridge portion uniformly, another apparatus, for example, a magnetron sputtering apparatus, which has a similar mechanism as the above-stated ECR sputtering apparatus, can be used.

In Embodiments 1 and 2, the AlGaInP based semiconductor laser is described as an example, but even when the technique of the present embodiment is applied to a laser of another material system, for example, an AlGaAs based laser, in which the refractive index of the cladding layer is lower than that of the current blocking layer, a semiconductor laser with excellent characteristics can be obtained as well. Furthermore, the structure of the semiconductor laser is not limited to the structure described in the present embodiment, and can be applied to any structure of the semiconductor laser as long as it is a ridge type structure.

Also, in Embodiments 1 and 2, the case where silicon nitride is used as a material with a barrier property against hydrogen was described, but aluminum nitride, aluminum oxide or a compound containing these materials also was confirmed to have a barrier effect against hydrogen. In addition, titanium nitride and titanium aluminum nitride (TiAlN) also have a great barrier effect against hydrogen.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor laser, comprising:
   a first conductivity-type cladding layer;
   a second conductivity-type cladding layer having at least one ridge structure extending in a direction of a resonator;
   an active layer disposed between the two cladding layers; and
   a current blocking layer provided so as to cover at least a side face of the ridge structure,
   wherein the current blocking layer comprises a hydrogenated first dielectric film.

2. The semiconductor laser according to claim 1, wherein the current blocking layer comprises a second dielectric film disposed between the first dielectric film and the ridge structure for preventing diffusion of hydrogen.

3. The semiconductor laser according to claim 1, wherein the first dielectric film comprises amorphous silicon.

4. The semiconductor laser according to claim 2, wherein the first dielectric film comprises amorphous silicon.

5. The semiconductor laser according to claim 2, wherein a film thickness of the hydrogenated amorphous silicon layer comprising hydrogen is 0.1 µm or larger.

6. The semiconductor laser according to claim 2, wherein second dielectric films are provided on both surfaces of the first dielectric film.

7. The semiconductor laser according to claim 2, wherein the second dielectric film comprises nitrogen or aluminum.

8. The semiconductor laser according to claim 6, wherein the second dielectric film comprises nitrogen or aluminum.

9. The semiconductor laser according to claim 2, wherein the second dielectric film is composed of silicon nitride (SiN), aluminum nitride (AlN), aluminum oxide ($Al_2O_3$), a compound containing these materials, or titanium aluminum nitride (AlTiN).

10. The semiconductor laser according to claim 6, wherein the second dielectric film is composed of silicon nitride (SiN), aluminum nitride (AN), aluminum oxide ($Al_2O_3$), a compound containing these materials, or titanium aluminum nitride (AlTiN).

11. The semiconductor laser according to claim 2, wherein the first dielectric film and the second dielectric film are adjacent to each other.

12. The semiconductor laser according to claim 6, wherein the first dielectric film and the second dielectric film are adjacent to each other.

13. The semiconductor laser according to claim 2, wherein a film thickness of the second dielectric film is in a range of 2 nm to 50 nm, inclusive.

14. The semiconductor laser according to claim 6, wherein a film thickness of the second dielectric film is in a range of 2 nm to 50 nm, inclusive.

15. The semiconductor laser according to claim 13, wherein a film thickness of the second dielectric film is in a range of 5 nm to 50 nm, inclusive.

16. The semiconductor laser according to claim 14, wherein a film thickness of the second dielectric film is in a range of 5 nm to 50 nm, inclusive.

* * * * *